US011244839B2

(12) United States Patent
Lee et al.

(10) Patent No.: US 11,244,839 B2
(45) Date of Patent: Feb. 8, 2022

(54) PLASMA PROCESSING APPARATUS

(71) Applicant: SAMSUNG ELECTRONICS CO., LTD., Suwon-si (KR)

(72) Inventors: Cheonkyu Lee, Hwaseong-si (KR); Siqing Lu, Seongnam-si (KR); Takafumi Noguchi, Prefecture (JP)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 296 days.

(21) Appl. No.: 16/385,919

(22) Filed: Apr. 16, 2019

(65) Prior Publication Data
US 2020/0066557 A1  Feb. 27, 2020

(30) Foreign Application Priority Data
Aug. 27, 2018  (KR) .......................... 10-2018-0100574

(51) Int. Cl.
*H01L 21/67* (2006.01)
*H01L 21/683* (2006.01)
*H01J 37/32* (2006.01)

(52) U.S. Cl.
CPC .. *H01L 21/67109* (2013.01); *H01J 37/32715* (2013.01); *H01J 37/32724* (2013.01); *H01L 21/67103* (2013.01); *H01L 21/67248* (2013.01); *H01L 21/6833* (2013.01)

(58) Field of Classification Search
None
See application file for complete search history.

(56) References Cited

U.S. PATENT DOCUMENTS

| 5,247,424 A | 9/1993 | Harris et al. |
| 5,901,783 A | 5/1999 | Dobak, III et al. |
| 5,941,083 A | 8/1999 | Sada et al. |
| 6,072,922 A | 6/2000 | Albin et al. |
| 8,623,173 B2 | 1/2014 | Son |
| 9,607,803 B2 | 3/2017 | Huseinovic et al. |

(Continued)

FOREIGN PATENT DOCUMENTS

| JP | 2901546 | 6/1999 |
| JP | 3276553 | 4/2002 |

(Continued)

OTHER PUBLICATIONS

English machine translation of Nagai et al. (JP-2016018918-A) retrieved from ESPACENET Mar. 18, 2021 (Year: 2021).*

*Primary Examiner* — Rakesh K Dhingra
*Assistant Examiner* — Laureen Chan
(74) *Attorney, Agent, or Firm* — F. Chau & Associates, LLC

(57) ABSTRACT

A plasma processing apparatus includes a process chamber, a substrate chuck disposed in the process chamber, and a temperature controller. The substrate chuck is configured to receive a substrate, and includes a cooling channel through which a coolant flows. The temperature controller is configured to control a temperature of the coolant supplied to the cooling channel. The temperature controller includes a cooler configured to cool the coolant supplied to the cooling channel, a heater configured to heat the coolant supplied to the cooling channel, and a 3-way valve configured to regulate a first flow rate of the coolant passing through the cooler and a second flow rate of the coolant passing through the heater.

12 Claims, 13 Drawing Sheets

(56) References Cited

U.S. PATENT DOCUMENTS

| | | |
|---|---|---|
| 9,779,955 B2 | 10/2017 | Lill et al. |
| 9,916,967 B2 | 3/2018 | Buchberger, Jr. |
| 2001/0003334 A1* | 6/2001 | Kano ............... H01L 21/67103 219/444.1 |
| 2001/0042386 A1 | 11/2001 | Allam et al. |
| 2008/0093057 A1 | 4/2008 | Choi et al. |
| 2008/0178608 A1 | 7/2008 | Tandou et al. |
| 2009/0277883 A1* | 11/2009 | Tandou ............ H01L 21/67109 219/121.49 |
| 2010/0323313 A1* | 12/2010 | Toriya ................. C23C 16/4586 432/200 |
| 2012/0038120 A1 | 2/2012 | Bartlett et al. |
| 2013/0109190 A1 | 5/2013 | Lill et al. |
| 2013/0180662 A1* | 7/2013 | Sato ................. H01J 37/32082 156/345.51 |
| 2014/0070286 A1 | 3/2014 | Rajagopal et al. |
| 2017/0092471 A1* | 3/2017 | Wakai ............... H01J 37/32082 |
| 2017/0250087 A1 | 8/2017 | Lill et al. |
| 2017/0323813 A1* | 11/2017 | Silveira ............... H01J 37/3299 |
| 2017/0358460 A1 | 12/2017 | Tomura et al. |
| 2017/0365578 A1 | 12/2017 | Nakamura et al. |
| 2017/0372911 A1 | 12/2017 | Lill et al. |
| 2017/0372916 A1 | 12/2017 | Kudo et al. |
| 2018/0218887 A1* | 8/2018 | Arita ................. H01L 21/67103 |
| 2018/0310362 A1 | 10/2018 | Tsuchida ................ H05B 3/265 |
| 2018/0337081 A1* | 11/2018 | Ye ....................... H01L 21/6833 |
| 2018/0358262 A1 | 12/2018 | Lu et al. |
| 2018/0374679 A1* | 12/2018 | Ito ..................... H01J 37/32522 |
| 2019/0385828 A1* | 12/2019 | Singhal ............. H01J 37/32724 |
| 2020/0066496 A1* | 2/2020 | Kitamura ............. H01L 21/6831 |

FOREIGN PATENT DOCUMENTS

| | | |
|---|---|---|
| JP | 2015211201 | 11/2015 |
| JP | 2016018918 A * | 2/2016 |
| JP | 6054733 | 12/2016 |
| KR | 1020010090375 | 10/2001 |
| KR | 1020180134037 | 12/2018 |

* cited by examiner

PLASMA PROCESSING APPARATUS

CROSS-REFERENCE TO RELATED APPLICATIONS

This application claims priority under 35 U.S.C. § 119 to Korean Patent Application No. 10-2018-0100574, filed on Aug. 27, 2018 in the Korean Intellectual Property Office, the disclosure of which is incorporated by reference herein in its entirety.

TECHNICAL FIELD

Exemplary embodiments of the inventive concept relate to a semiconductor manufacturing apparatus, and more particularly, to a plasma processing apparatus.

DISCUSSION OF THE RELATED ART

To manufacture a semiconductor device, a series of processes such as deposition, etching, cleaning, etc. may be performed. These processes may be performed through a deposition, etching, or cleaning apparatus having a process chamber. For example, in the case of an etching process, a plasma etching apparatus for etching a material film on a substrate by using a plasma technique that uses, for example, capacitively coupled plasma or inductively coupled plasma, is widely used. In a plasma etching process, it is desirable to precisely control the temperature of a wafer, since the temperature affects uniformity of the etching process.

SUMMARY

Exemplary embodiments of the inventive concept provide a plasma processing apparatus capable of improving uniformity of a plasma processing process.

According to an exemplary embodiment of the inventive concept, a plasma processing apparatus includes a process chamber, a substrate chuck disposed in the process chamber, and a temperature controller. The substrate chuck is configured to receive a substrate, and includes a cooling channel through which a coolant flows. The temperature controller is configured to control a temperature of the coolant supplied to the cooling channel. The temperature controller includes a cooler configured to cool the coolant supplied to the cooling channel, a heater configured to heat the coolant supplied to the cooling channel, and a 3-way valve configured to regulate a first flow rate of the coolant passing through the cooler and a second flow rate of the coolant passing through the heater.

According to an exemplary embodiment of the inventive concept, a plasma processing apparatus includes a process chamber, a substrate chuck disposed in the process chamber, and a temperature controller configured to control a temperature of the substrate chuck. The substrate chuck is configured to receive a substrate and includes a cooling channel through which a coolant flows. The cooling channel includes a first channel and a second channel. The first channel is disposed near an edge portion of the substrate chuck, and the second channel is disposed near a central portion of the substrate chuck. The temperature controller is configured to control a first flow rate of the coolant flowing through the first channel and a second flow rate of the coolant flowing through the second channel.

According to an exemplary embodiment of the inventive concept, a plasma processing apparatus includes a process chamber, a substrate chuck disposed in the process chamber, and a power rod configured to transfer power to the substrate chuck. The substrate chuck is configured to receive a substrate. The power rod includes a core portion and a shell portion covering the core portion.

According to an exemplary embodiment of the inventive concept, a plasma processing apparatus includes a process chamber, a substrate chuck disposed in the process chamber, a support disposed below the substrate chuck and configured to support the substrate chuck, a power rod disposed in a through hole of the support and configured to transfer power to the substrate chuck, and a first heat block layer disposed on an inner wall of the support and configured to reflect infrared rays. The substrate chuck is configured to receive a substrate, and the inner wall is formed by the through hole.

According to an exemplary embodiment of the inventive concept, a plasma processing apparatus includes a process chamber, a substrate chuck disposed in the process chamber and configured to receive a substrate, and a cover ring surrounding an edge of the substrate chuck and including a quartz body comprising silicon impurities.

BRIEF DESCRIPTION OF THE DRAWINGS

The above and other features of the present inventive concept will become more apparent by describing in detail exemplary embodiments thereof with reference to the accompanying drawings, in which.

DETAILED DESCRIPTION OF THE EXEMPLARY EMBODIMENTS

Figure 1:
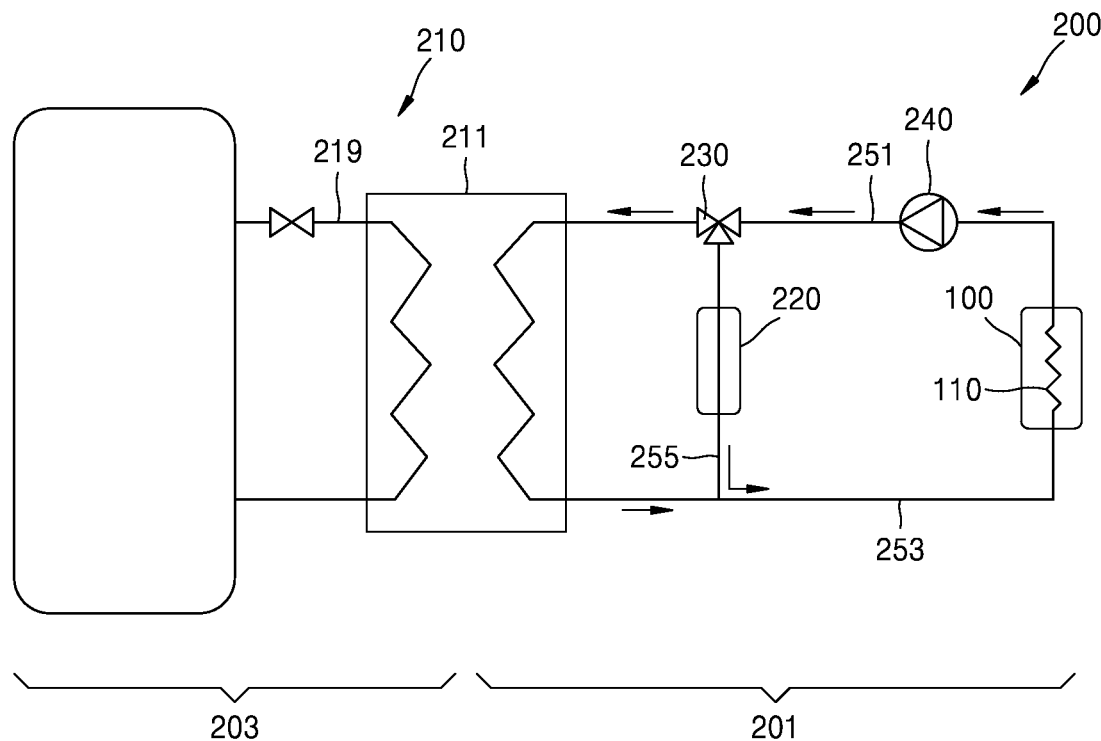
FIG. 1 is a schematic diagram illustrating a temperature controller for a substrate chuck according to exemplary embodiments.

Exemplary embodiments of the inventive concept will be described more fully hereinafter with reference to the accompanying drawings. Like reference numerals may refer to like elements throughout the accompanying drawings.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below.

It will be understood that when a component, such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component.

It will be understood that the terms "first," "second," "third," etc. are used herein to distinguish one element from another, and the elements are not limited by these terms. Thus, a "first" element in an exemplary embodiment may be described as a "second" element in another exemplary embodiment.

It should be understood that descriptions of features or aspects within each exemplary embodiment should typically be considered as available for other similar features or aspects in other exemplary embodiments, unless the context clearly indicates otherwise.

FIG. 1 is a schematic diagram illustrating a temperature controller 200 for a substrate chuck 100 according to exemplary embodiments.

Referring to FIG. 1, the temperature controller 200 may control a temperature of the substrate chuck 100 on which a substrate, such as a wafer, is mounted. A cooling channel 110 through which a coolant may flow may be included inside the substrate chuck 100. For example, the cooling channel 110 may have a concentric or helical pipe structure with respect to a central axis of the substrate chuck 100, and may provide a path through which the coolant may flow.

The temperature controller 200 may adjust the temperature of the substrate chuck 100 and a temperature of the substrate mounted on the substrate chuck 100 by adjusting a flow rate and/or a temperature of the coolant supplied to the cooling channel 110.

The coolant may include materials operable in a wide temperature range. For example, the coolant may include water, ethylene glycol, silicon oil, liquid TEFLON, or mixtures thereof. For example, the temperature controller 200 may adjust the temperature of the coolant to a cryogenic temperature range, for example, a temperature range between about −20° C. and about −120° C., or a temperature range between about −50° C. and about −100° C., or may adjust the temperature of the coolant to a room temperature.

The temperature controller 200 may include a cooler 210 configured to cool the coolant and a heater 220 configured to heat the coolant. The substrate chuck 100, the cooler 210, and the heater 220 may be connected to one another through a flow path through which the coolant flows. The cooler 210 may include any known cooling device for cooling the coolant flowing through the flow path. For example, the cooler 210 may include a heat-exchanger that performs a heat exchange process between the coolant flowing through the flow path and a refrigerant supplied from a refrigerator. The heater 220 may include any known heating device for heating the coolant flowing through the flow path. For example, the heater 220 may include an electric heating device installed on the flow path. A pump 240 for circulating the coolant may be installed in the flow path. The cooler 210, the heater 220, and the pump 240 may constitute a coolant cycle 201 through which the coolant circulates.

The temperature controller 200 may include a 3-way valve 230 for controlling a flow rate of the coolant passing through the cooler 210 and a flow rate of the coolant passing through the heater 220. The temperature controller 200 may control the flow rate of the coolant passing through the cooler 210 and the flow rate of the coolant passing through the heater 220 through the 3-way valve 230, and may control the temperature of the coolant supplied to the substrate chuck 100.

For example, the cooler 210 and an outlet of the cooling channel 110 may be connected by a first flow path 251, the cooler 210 and an inlet of the cooling channel 110 of the substrate chuck 100 may be connected by a second flow path 253, and the heater 220 may be installed in a third flow path 255 connecting the first flow path 251 and the second flow path 253. The third flow path 255 may directly connect the first flow path 251 and the second flow path 253 such that the coolant may be wholly or partially supplied to the substrate chuck 100 without passing through the cooler 210. The 3-way valve 230 may be disposed at a position where the first flow path 251 and the third flow path 255 cross each other, thereby controlling the flow rate of the coolant passing through the cooler 210 and the flow rate of the coolant passing through the heater 220. In this case, the temperature of the coolant supplied to the substrate chuck 100 may be determined according to a mixture of the coolant passing through the cooler 210 and the coolant passing through the heater 220. Thus, in an exemplary embodiment, the temperature controller 200 may control the temperature of the substrate chuck 100 by supplying, to the substrate chuck 100, a mixed coolant including a mixture of the coolant passing through the cooler 210 and the coolant passing through the heater 220.

In exemplary embodiments, the temperature controller 200 may control the 3-way valve 230 to reduce or completely block the flow rate of the coolant passing through the cooler 210 and to increase the flow rate of the coolant passing through the heater 220, thereby rapidly increasing the temperature of the coolant. The temperature controller 200 may also control the 3-way valve 230 to reduce or completely block the flow rate of the coolant passing through the heater 220 and to increase the flow rate of the coolant passing through the cooler 210, thereby rapidly lowering the temperature of the coolant.

In exemplary embodiments, the cooler 210 may include a refrigerant cycle 203 in which a refrigerant for cooling circulates. The refrigerant cycle 203 may share a heat exchanger 211 with the coolant cycle 201 through which the coolant circulates. The heat exchanger 211 may perform a heat exchange process on the refrigerant supplied from a refrigerant flow path 219 through which the refrigerant flows and the coolant supplied through the first flow path 251, thereby cooling the coolant.

The substrate chuck 100 may be, for example, an electrostatic chuck (ESC) that fixes the substrate using an electrostatic force. For example, the substrate may be fixed/adhered to the ESC by an electrostatic force. The ESC may be used in a plasma processing apparatus that processes a wafer using plasma. In this case, the ESC may be provided in a process chamber for performing a plasma processing process and may function as an electrode for plasma generation. When the wafer is exposed to plasma generated in the process chamber, a high thermal load may occur due to an ion bombardment applied to the wafer, which may cause a non-uniform plasma processing process to be performed. However, according to exemplary embodiments, in the plasma processing process performed on the wafer, the temperature controller 200 may precisely control the temperature of the coolant supplied to the cooling channel 110 of the substrate chuck 100, thereby removing the thermal load applied to the wafer. As a result, uniformity of the plasma processing process may be improved.

The substrate chuck 100 may be used in a plasma etching apparatus for performing cryogenic etching on a wafer. Cryogenic etching may be performed within a cryogenic temperature range, for example, between about −20° C. and about −120° C., or between about −50° C. and about −100° C. In a cryogenic etching process, an etching profile for the wafer may be adjusted according to a temperature of the wafer, and an etching process with high aspect ratio characteristics may be performed by appropriately controlling the temperature of the substrate chuck 100. According to exemplary embodiments, the temperature of the coolant may be quickly controlled by controlling the flow rate passing through the cooler 210 and the flow rate passing through the heater 220 through the 3-way valve 230, thereby quickly providing a temperature suitable for performing the cryogenic etching process to the wafer.

Further, to increase the temperature of the substrate chuck 100, the temperature of the coolant may be quickly increased by reducing or blocking the flow rate of the coolant passing through the cooler 210 and increasing the flow rate of the coolant passing through the heater 220. Thus, like preventive maintenance (PM) for the plasma processing apparatus, when it is necessary to increase a temperature from a cryogenic temperature to a temperature suitable for PM, the temperature controller 200 may cause most of the coolant to flow to the heater 220, thereby rapidly increasing the temperature of the substrate chuck 100.

Figure 2:
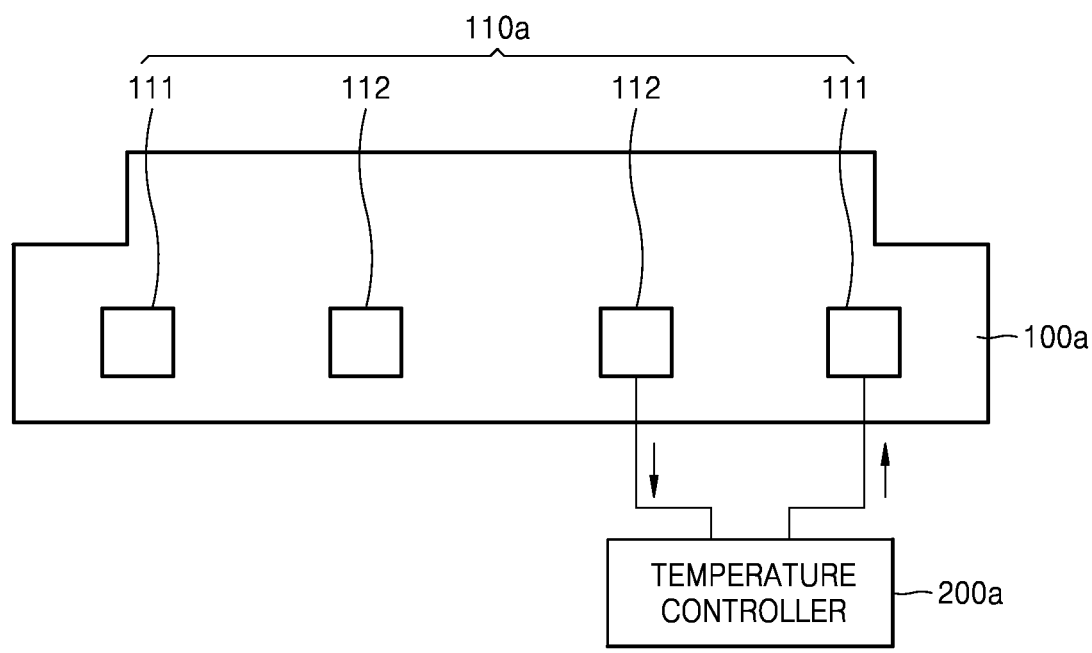
FIG. 2 is a cross-sectional view showing a substrate chuck according to exemplary embodiments.
Figure 3:
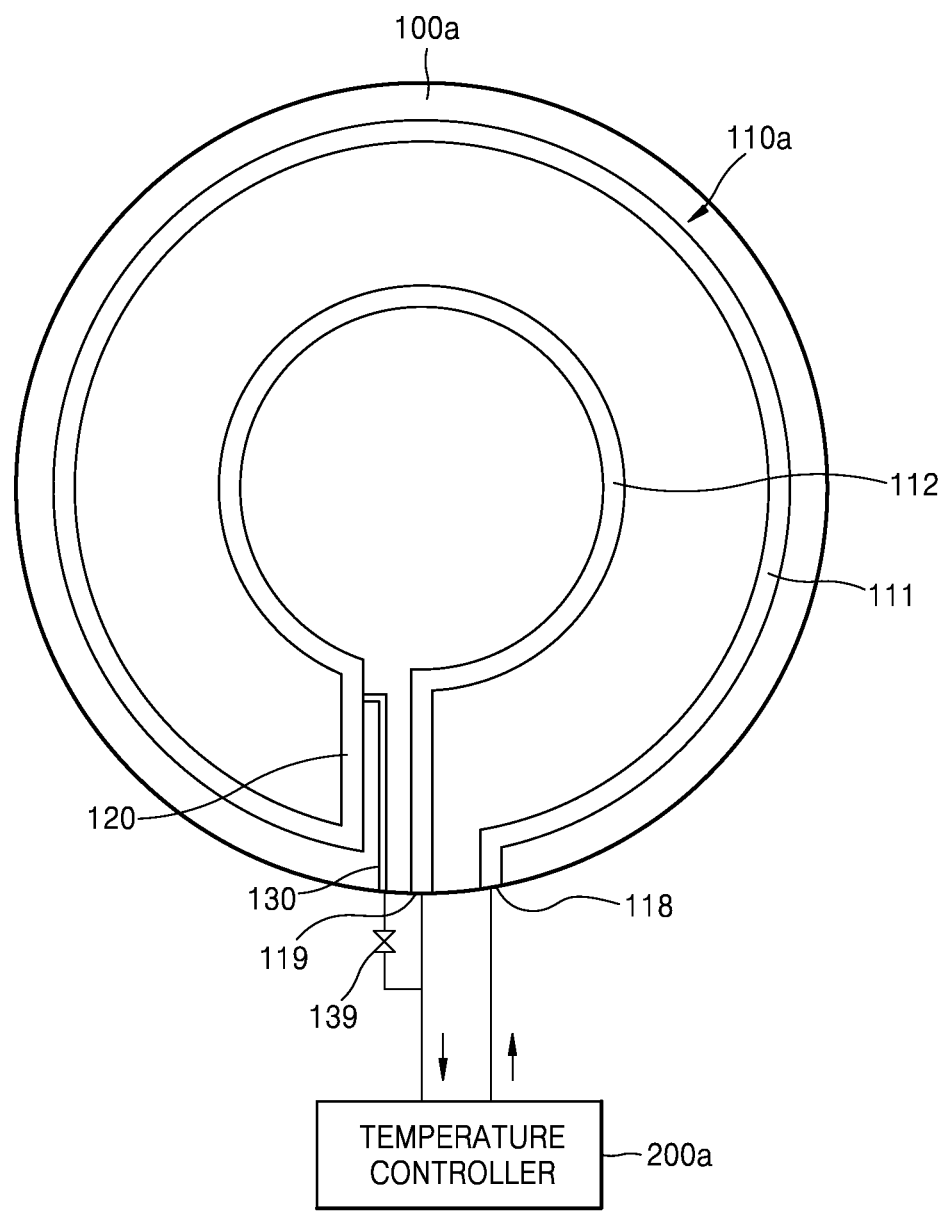
FIG. 3 is a view for describing a cooling channel of the substrate chuck shown in FIG. 2.

FIG. 2 is a cross-sectional view showing a substrate chuck 100a according to exemplary embodiments. FIG. 3 is a view for describing a cooling channel 110a of the substrate chuck 100a shown in FIG. 2.

Referring to FIGS. 2 and 3, the cooling channel 110a through which a coolant may flow may be provided inside the substrate chuck 100a.

The cooling channel 110a may include a first channel 111, a second channel 112, and a connection channel 120. The first channel 111 may extend near the circumference of the substrate chuck 100a, and the second channel 112 may be disposed inside the first channel 111. For example, the second channel 112 may be disposed within and may be concentric with the first channel 111. For example, the round portion of the first channel 111 may be larger than and surround the round portion of the second channel 112, and the first channel 111 and the second channel 112 may have the same center on the substrate chuck 100a. The first channel 111 may have an inlet into which a coolant flows, and the second channel 112 may have an outlet 119 from which the coolant flows. The first channel 111 may be adjacent to an edge of the substrate chuck 100a, and the second channel 112 may be adjacent to a central portion of the substrate chuck 100a. For example, the radial distance between the edge of the substrate chuck 100a and the first channel 111 may be smaller than the radial distance between the edge of the substrate chuck 100a and the second channel 112. The connection channel 120 may extend between the first channel 111 and the second channel 112, and may guide the coolant between the first channel 111 and the second channel 112. For example, the coolant may pass between the first channel 111 and the second channel 112 via the connection channel 120.

The first channel 111, the connection channel 120, and the second channel 112 may be sequentially connected to form one flow path. In exemplary embodiments, the coolant may flow into the first channel 111 and may sequentially flow through the first channel 111, the connection channel 120, and the second channel 112. Alternatively, in exemplary embodiments, the coolant may flow into the second channel 112 and may sequentially flow through the second channel 112, the connection channel 120, and the first channel 111.

The cooling channel 110a may include a bypass channel 130 diverging from the connection channel 120 and extending to the outside of the substrate chuck 100a. The bypass channel 130 may be configured to partially discharge the coolant flowing from the first channel 111 to the second channel 112 to the outside of the substrate chuck 100a. The bypass channel 130 may include a valve 139 for controlling a flow rate of the coolant flowing through the bypass channel 130. The coolant flowing through the bypass channel 130 may be combined with a main flow of the coolant flowing through the second channel 112.

In exemplary embodiments, a temperature controller 200a may control the flow rate of the coolant discharged through the bypass channel 130 such that a temperature of the substrate chuck 100a is uniform throughout. For example, the temperature controller 200a may detect a temperature of the central portion of the substrate chuck 100a and a temperature of an edge portion of the substrate chuck 100a based on an output signal of a temperature sensor (see 1114 in FIG. 14) provided on the substrate chuck 100a and, when it is determined that the temperature of the edge portion of the substrate chuck 100a is higher than the temperature of the central portion of the substrate chuck 100a, may discharge the coolant through the bypass channel 130. As the coolant is partially discharged to the outside of the substrate chuck 100a through the bypass channel 130, a second flow rate of the coolant flowing through the second channel 112 may be smaller than a first flow rate of the coolant flowing through the first channel 111. In this case, a cooling rate of the central portion of the substrate chuck 100a by the second channel 112 may be reduced in correspondence with a decrease in the flow rate of the coolant flowing through the second channel 112 near the central portion of the substrate chuck 100a, and the temperature of the central portion of the substrate chuck 100a may locally increase.

For example, during a plasma processing process in a cryogenic temperature range, the edge portion of the substrate chuck 100a may have a relatively higher temperature than the central portion of the substrate chuck 100a as a result of heat transferred from a component provided around the substrate chuck 100a. Such a temperature difference between the central portion and the edge portion of the substrate chuck 100a may cause a non-uniform plasma processing process to be performed. However, according to exemplary embodiments, the temperature difference between the central portion and the edge portion of the substrate chuck 100a may be substantially reduced or removed by adjusting the flow rate of the coolant discharged through the bypass channel 130, thereby removing a process non-uniformity caused by a non-uniform temperature.

Figure 4:
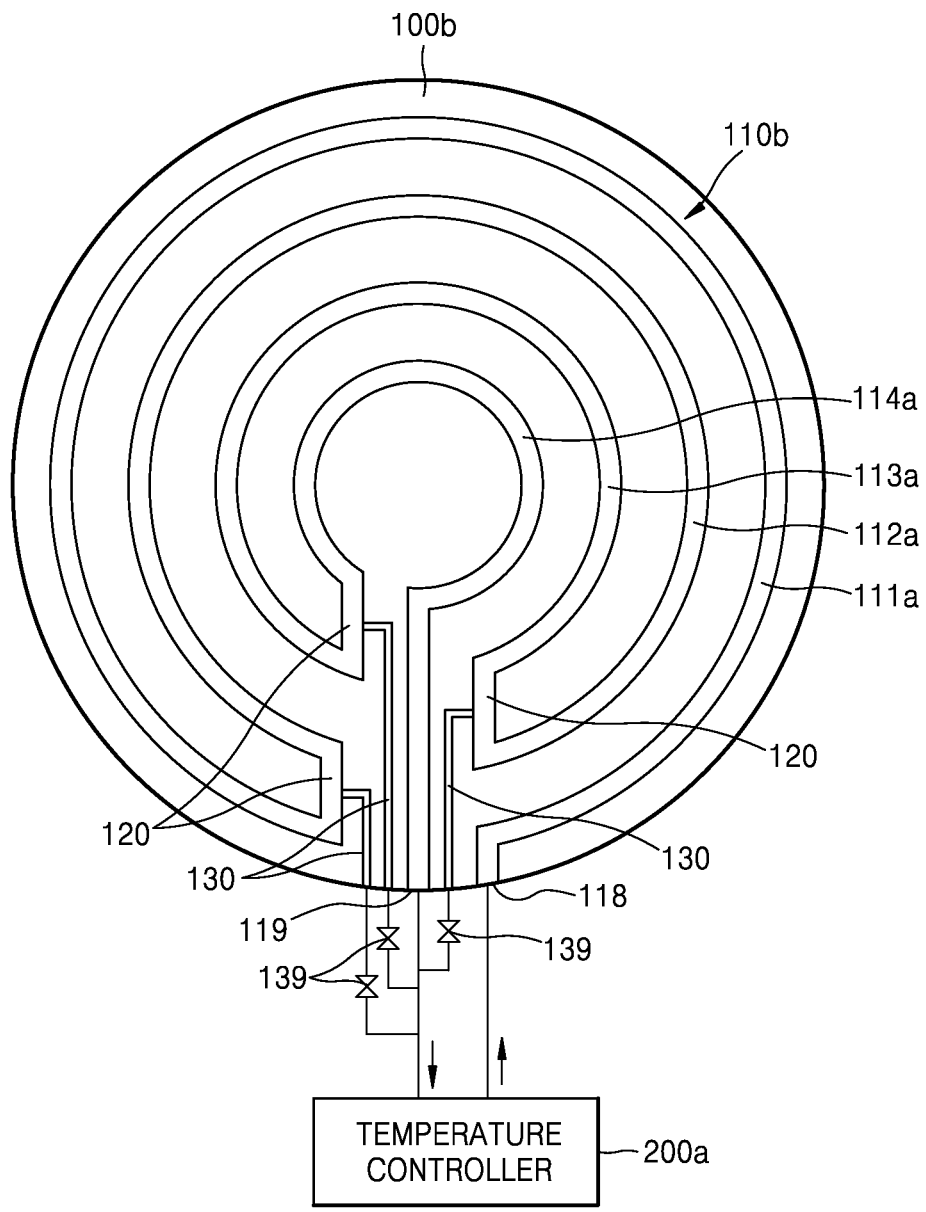
FIG. 4 is a view for describing a cooling channel of a substrate chuck according to exemplary embodiments.

FIG. 4 is a view for describing a cooling channel 110b of a substrate chuck 100b according to exemplary embodiments.

Referring to FIG. 4, the cooling channel 110b may include three or more channels sequentially disposed from an edge of the substrate chuck 100b toward a center of the substrate chuck 100b. For example, the cooling channel 110b may include a first channel 111a, a second channel 112a, a third channel 113a, and a fourth channel 114a sequentially disposed from the edge of the substrate chuck 100b toward the center of the substrate chuck 100b. The first channel 111a may extend near the circumference of the substrate chuck 100b. Each of the second channel 112a, the third channel 113a, and the fourth channel 114a may be disposed within the first channel 111a and may be concentric with the first channel 111a.

For example, the radial distance between the edge of the substrate chuck 100b and the first channel 111a may be smaller than the radial distance between the edge of the substrate chuck 100b and the second channel 112a. Further, the radial distance between the edge of the substrate chuck 100b and the second channel 112a may be smaller than the radial distance between the edge of the substrate chuck 100b and the third channel 113a. Further, the radial distance between the edge of the substrate chuck 100b and the third channel 113a may be smaller than the radial distance between the edge of the substrate chuck 100b and the fourth channel 114a.

The first channel 111a may have an inlet 118 into which a coolant flows, and the fourth channel 114a may have an outlet 119 from which the coolant flows.

The first channel 111a, the second channel 112a, the third channel 113a, and the fourth channel 114a may be connected by the connection channels 120 to form one channel. Each of the connection channels 120 connecting the first channel 111a, the second channel 112a, the third channel 113a, and the fourth channel 114a may be connected to the bypass channels 130 for partially discharging the coolant to the outside of the substrate chuck 100b. The bypass channels 130 may each include a valve 139 for controlling a flow rate of the coolant flowing through the bypass channels 130. The temperature controller 200a may control a flow rate flowing through each of the first channel 111a, the second channel 112a, the third channel 113a, and the fourth channel 114a by controlling a flow rate discharged to the outside of the substrate chuck 100b along the bypass channels 130. Thus, a temperature between an edge portion of the substrate chuck 100b and a central portion of the substrate chuck 100b may be more uniformly and precisely controlled.

Figure 5:
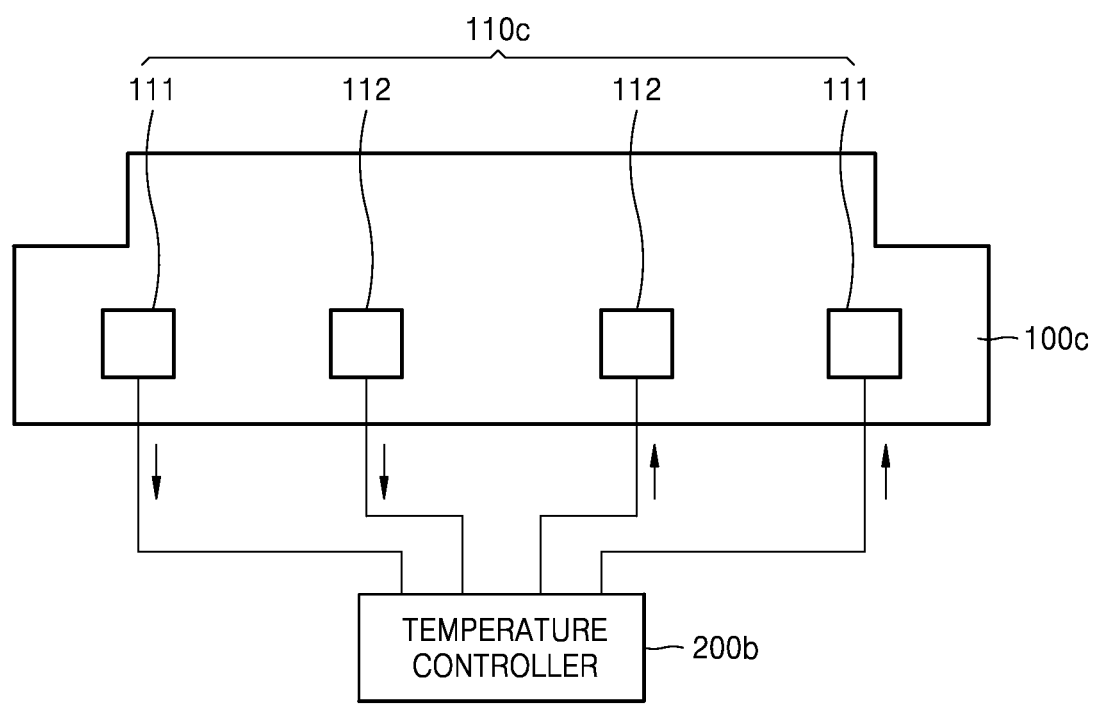
FIG. 5 is a cross-sectional view showing a substrate chuck according to exemplary embodiments.
Figure 6:
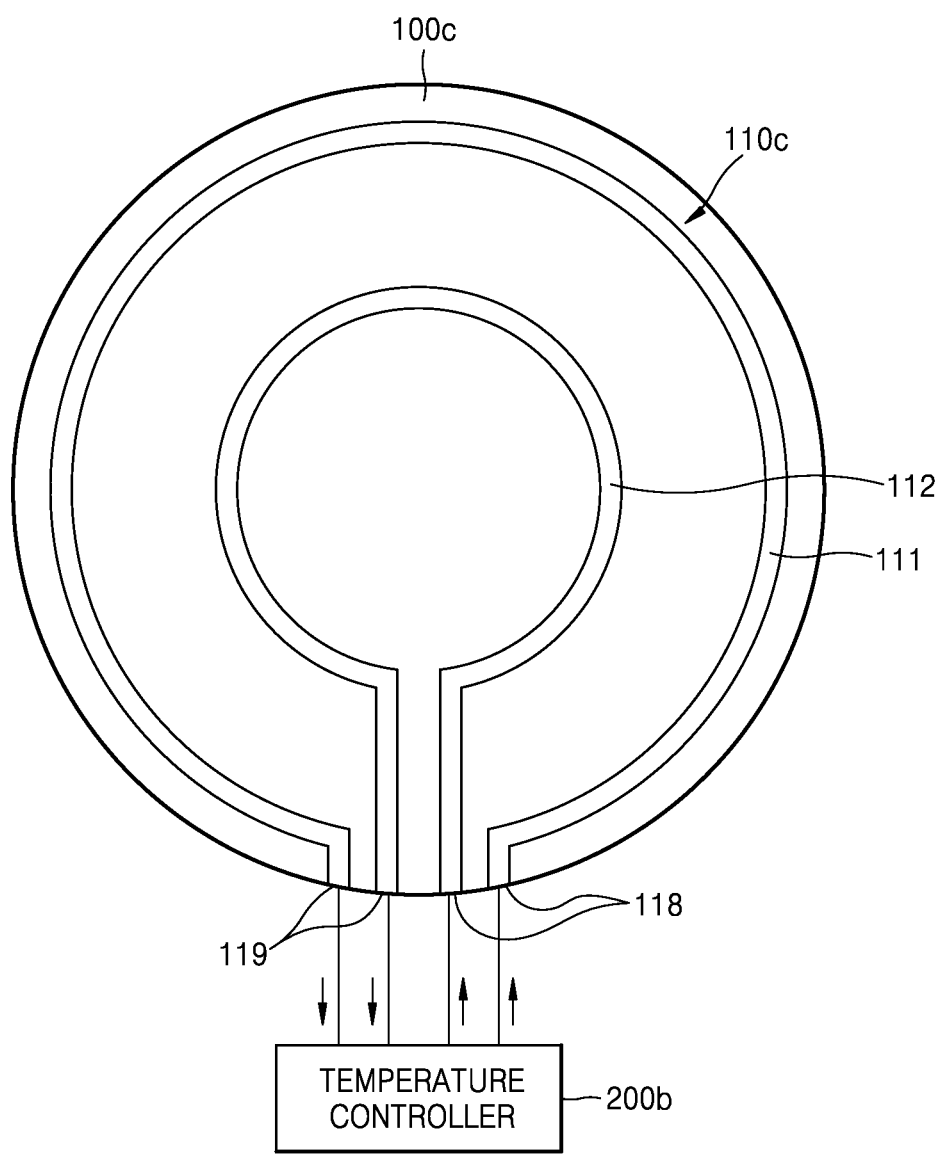
FIG. 6 is a view for describing a cooling channel of the substrate chuck shown in FIG. 5.

FIG. 5 is a cross-sectional view showing a substrate chuck 100c according to exemplary embodiments. FIG. 6 is a view for describing a cooling channel 110c of the substrate chuck 100c shown in FIG. 5.

Referring to FIGS. 5 and 6, the cooling channel 110c may include the first channel 111 and the second channel 112, which are separated from each other. The first channel 111 may extend near the circumference of the substrate chuck 100c. The second channel 112 may be disposed within and may be concentric with the first channel 111. For example, the round portion of the first channel 111 may be larger than and surround the round portion of the second channel 112, and the first channel 111 and the second channel 112 may have the same center on the substrate chuck 100c. The first channel 111 and the second channel 112 may each have an inlet 118 into which a coolant flows and an outlet 119 from which the coolant flows. The first channel 111 and the second channel 112 may form respective independent flow paths. The second channel 112 may be disposed inside the first channel 111. The first channel 111 may be adjacent to an edge portion of the substrate chuck 100c. The second channel 112 may be adjacent to a central portion of the substrate chuck 100c. For example, the radial distance between the edge of the substrate chuck 100c and the first channel 111 may be smaller than the radial distance between the edge of the substrate chuck 100c and the second channel 112.

In exemplary embodiments, the temperature controller 200b may control a first flow rate of the coolant flowing through the first channel 111 and a second flow rate of the coolant flowing through the second channel 112 such that a temperature of the substrate chuck 100c is uniform throughout. For example, the temperature controller 200b may detect a temperature of the central portion of the substrate chuck 100c and a temperature of the edge portion of the substrate chuck 100c based on an output signal of a temperature sensor (see 1114 in FIG. 14) provided on the substrate chuck 100c and, when it is determined that the temperature of the edge portion of the substrate chuck 100a is higher than the temperature of the central portion of the substrate chuck 100a, may cause the second flow rate of the coolant flowing through the second channel 112 to be smaller than the first flow rate of the coolant flowing through the first channel 111. In this case, a cooling rate of the central portion of the substrate chuck 100c by the second channel 112 may be reduced in correspondence with a decrease in the flow rate of the coolant flowing through the second channel 112 near the central portion of the substrate chuck 100c, and the temperature of the central portion of the substrate chuck 100c may locally increase.

For example, when the edge portion of the substrate chuck 100c has a relatively higher temperature than the central portion of the substrate chuck 100c, the temperature controller 200b may control the first flow rate and the second flow rate such that the first flow rate flowing through the first channel 111 is greater than the second flow rate flowing through the second channel 112. In this case, the cooling rate of the central portion of the substrate chuck 100c by the second channel 112 may be reduced in correspondence with the decrease in the flow rate of the coolant flowing through the second channel 112 near the central portion of the substrate chuck 100c, and the temperature of the central portion of the substrate chuck 100c may locally increase. Since the temperature of the central portion of the substrate chuck 100c locally increases, the temperature of the central portion of the substrate chuck 100c and the temperature of the edge portion of the substrate chuck 100c may be uniform.

Figure 7:
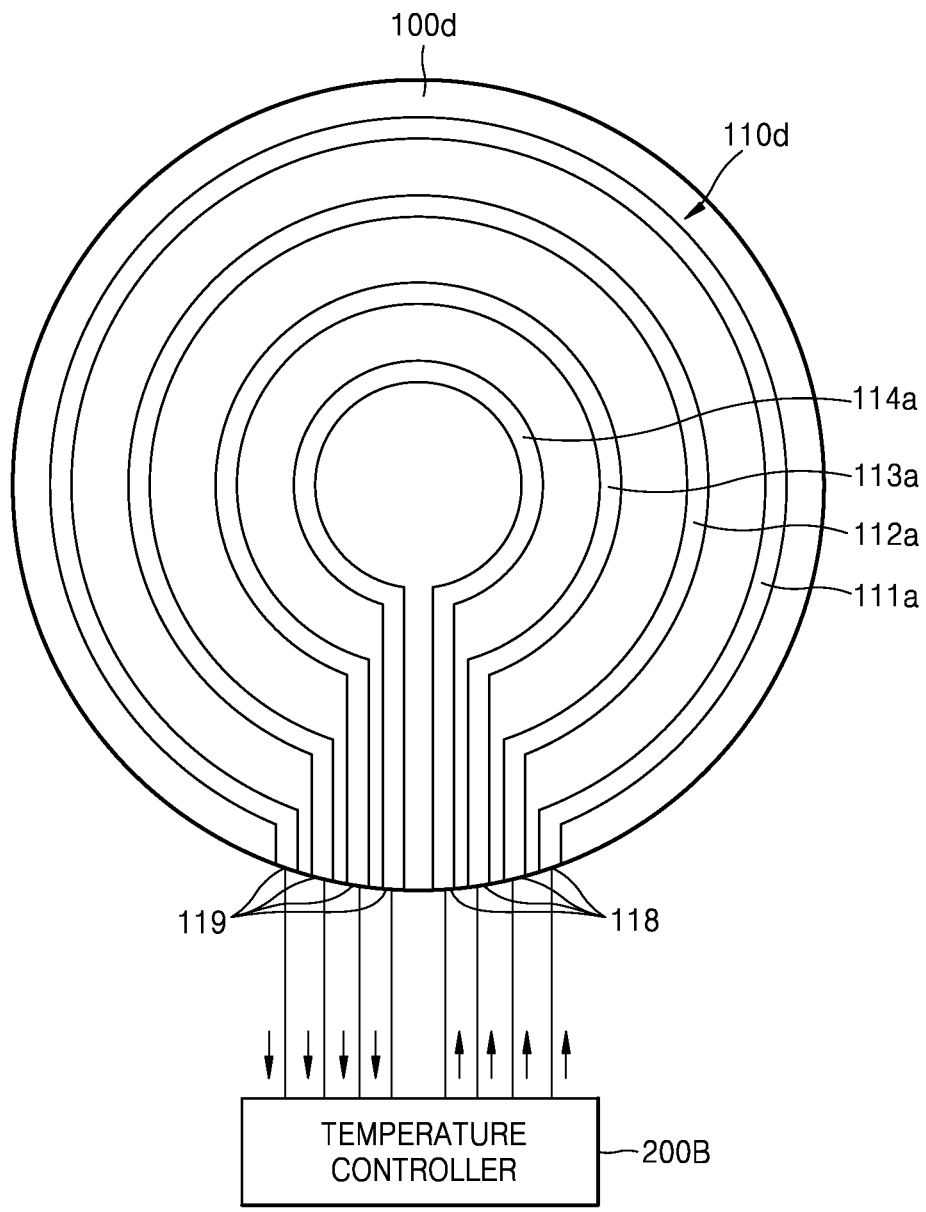
FIG. 7 is a view for describing a cooling channel of a substrate chuck according to exemplary embodiments.

FIG. 7 is a view for describing a cooling channel 110d of a substrate chuck 100d according to exemplary embodiments.

Referring to FIG. 7, the cooling channel 110d may include three or more channels sequentially disposed from an edge of the substrate chuck 100d toward a center of the substrate chuck 100d. For example, the cooling channel 110d may include the first channel 111a, the second channel 112a, the third channel 113a, and the fourth channel 114a sequentially disposed from the edge of the substrate chuck 100d toward the center of the substrate chuck 100d. The first channel 111a, the second channel 112a, the third channel 113a, and the fourth channel 114a may be separate from one another and may form respective independent flow paths.

The first channel 111a may extend near the circumference of the substrate chuck 100d. Each of the second channel 112a, the third channel 113a, and the fourth channel 114a may be disposed within the first channel 111a and may be concentric with the first channel 111a.

For example, the radial distance between the edge of the substrate chuck 100d and the first channel 111a may be smaller than the radial distance between the edge of the substrate chuck 100d and the second channel 112a. Further, the radial distance between the edge of the substrate chuck 100d and the second channel 112a may be smaller than the radial distance between the edge of the substrate chuck 100d and the third channel 113a. Further, the radial distance between the edge of the substrate chuck 100d and the third channel 113a may be smaller than the radial distance between the edge of the substrate chuck 100d and the fourth channel 114a.

The temperature controller 200b may control a flow rate flowing through each of the first channel 111a, the second channel 112a, the third channel 113a, and the fourth channel 114a sequentially disposed from the edge of the substrate chuck 100d toward the center of the substrate chuck 100d, thereby more uniformly and precisely controlling a temperature between an edge portion and a central portion of the substrate chuck 100d. Each of the first channel 111a, the second channel 112a, the third channel 113a, and the fourth channel 114a may have an inlet 118 into which a coolant flows and an outlet 119 from which the coolant flows.

Figure 8:
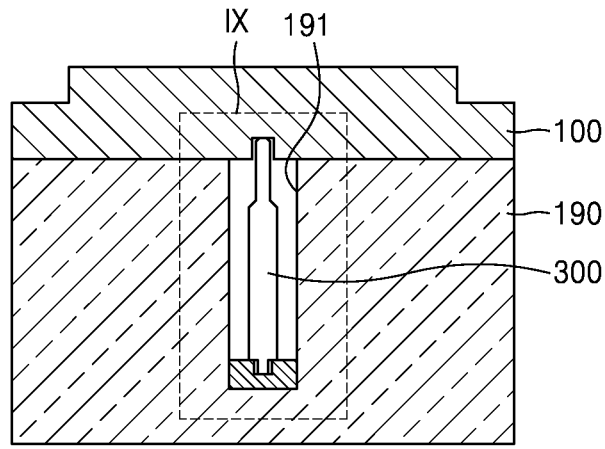
FIG. 8 is a cross-sectional view illustrating a part of a plasma processing apparatus according to exemplary embodiments.
Figure 9:
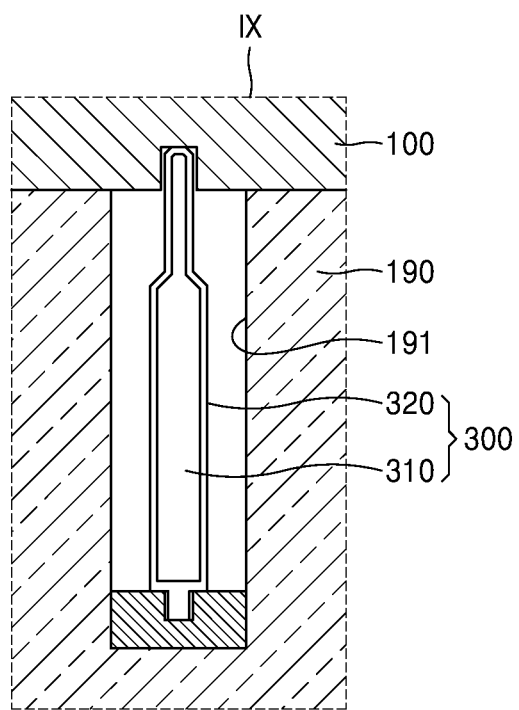
FIG. 9 is an enlarged view of region IX of FIG. 8.

FIG. 8 is a cross-sectional view illustrating a portion of a plasma processing apparatus according to exemplary embodiments. FIG. 9 is an enlarged view of region IX of FIG. 8.

Referring to FIGS. 8 and 9, the plasma processing apparatus may include the substrate chuck 100, a support 190 supporting the substrate chuck 100, and a power rod 300.

The power rod 300 may transfer power to the substrate chuck 100. For example, the power rod 300 may be a conductive element configured to transfer power to the substrate chuck 100. The power rod 300 may be inserted into a through hole 191 of the support 190 and may be connected to a lower portion of the substrate chuck 100. The power rod 300 may have a rod shape, and may have one end inserted into and fixed to the lower portion of the substrate chuck 100.

For example, the power rod 300 may be connected to a power source, such as a bias power source, and may be configured to transfer bias power generated by the power source to the substrate chuck 100. The substrate chuck 100 that receives power from the power rod 300 may function as an electrode for plasma generation during a plasma processing process.

The power rod 300 may include a core portion 310 and a shell portion 320 covering the core portion 310. The shell portion 320 may cover an outer portion of the core portion 310 and may be formed to have a substantially uniform thickness.

In exemplary embodiments, the core portion 310 may include a material having a relatively low thermal conductivity. The thermal conductivity of the core portion 310 may be less than a thermal conductivity of the shell portion 320. For example, the core portion 310 may include TEFLON or a ceramic material.

In an exemplary embodiment, the core portion 310 may include TEFLON, and the shell portion may include copper (Cu).

In exemplary embodiments, the shell portion 320 may include a material having a relatively high electrical conductivity. The electrical conductivity of the shell portion 320 may be higher than an electrical conductivity of the core portion 310. For example, the shell portion 320 may include copper (Cu), nickel (Ni), gold (Au), silver (Ag), aluminum (Al), etc.

When the core portion 310 includes a material having a low thermal conductivity, heat transfer due to conduction between the power rod 300 and the substrate chuck 100 may be reduced. For example, when the plasma processing process is performed in a cryogenic temperature range, a temperature difference between the substrate chuck 100 and the power rod 300 considerably increases, and due to the heat transfer by the power rod 300, the temperature of a part of the substrate chuck 100 to which the power rod 300 is connected may locally increase. However, according to exemplary embodiments, the core portion 310 of the power rod 300 may include the material having the low thermal conductivity such that a temperature uniformity of the substrate chuck 100 by the power rod 300 may be improved.

The power transfer through the power rod 300 may be performed through the shell portion 320 which most constitutes a surface portion of the power rod 300. Accordingly, even when the core portion 310 includes the material having the relatively low electrical conductivity, power transmission efficiency may be almost the same as compared with a case in which both the core portion 310 and the shell portion 320 include the material having the high electrical conductivity.

Figure 10:
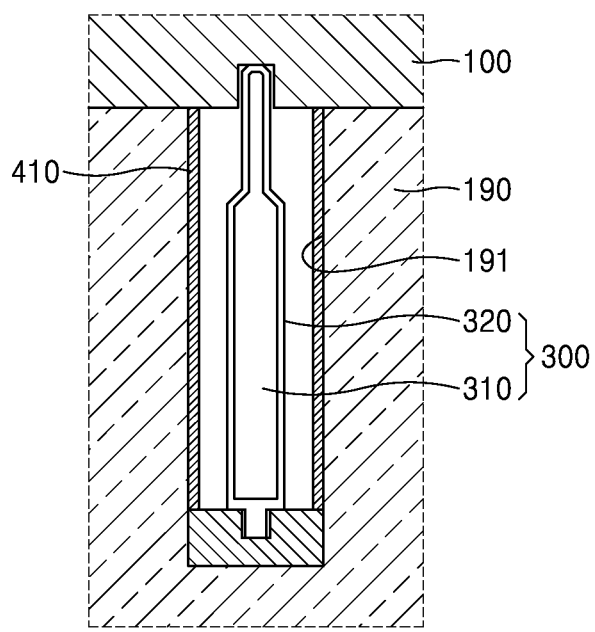
FIGS. 10 and 11 are cross-sectional views for describing first and second heat block layers included in a plasma processing apparatus, respectively, according to exemplary embodiments.
Figure 11:
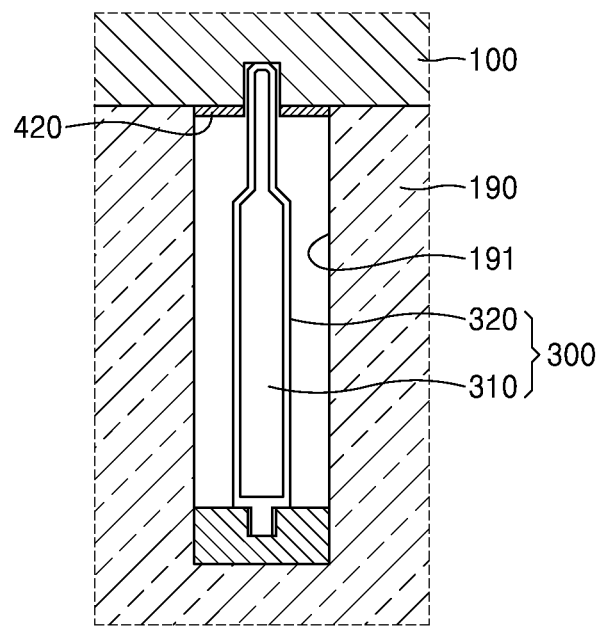

FIGS. 10 and 11 are cross-sectional views for describing first and second heat block layers 410 and 420 included in a plasma processing apparatus, respectively, according to exemplary embodiments.

Referring to FIG. 10, the plasma processing apparatus may include the substrate chuck 100, the support 190 for supporting the substrate chuck 100, the power rod 300 for supplying power to the substrate chuck 100, and the first heat block layer 410.

The first heat block layer 410 may be disposed on an inner wall of the support 190 formed by the through hole 191 of the support 190. For example, the first heat block layer 410 may be disposed on an inner wall of the through hole 191 of the support 190. The first heat block layer 410 may be an infrared reflector configured to block infrared rays, and may reflect or absorb infrared rays traveling from a component disposed below the substrate chuck 100 toward the substrate chuck 100.

For example, when a plasma processing process is performed in a cryogenic temperature range, a temperature difference between the substrate chuck 100 and other components in a process chamber may increase, and a radiant heat generated from a component having a relatively high temperature may be transferred to the substrate chuck 100. This radiant heat may cause a non-uniform temperature of the substrate chuck 100. However, according to exemplary embodiments, the first heat block layer 410 may reflect or absorb infrared rays below the substrate chuck 100, thereby preventing a temperature uniformity of the substrate chuck 100 from being lowered due to a transfer of the radiant heat.

In exemplary embodiments, the first heat block layer 410 may include a material having a high infrared reflectance. For example, the first heat block layer 410 may include gold (Au), silver (Ag), titanium dioxide (TiO$_2$), aluminum nitride (AlN), zinc oxide (ZnO), or combinations thereof.

The first heat block layer 410 may have a film form. The first heat block layer 410 may have a single-layer structure, or may have a multi-layer structure. When the first heat block layer 410 has the multi-layer structure, the first heat block layer 410 may include a reflective material layer and an adhesive material layer disposed between the reflective material layer and an inner wall of the support 190 to enhance an absorption force of the reflective material layer.

Referring to FIG. 11, the plasma processing apparatus may include the substrate chuck 100, the support 190 for supporting the substrate chuck 100, the power rod 300 for supplying power to the substrate chuck 100, and the second heat block layer 420.

The second heat block layer 420 may be disposed on a lower surface of the substrate chuck 100. The second heat block layer 420 may reflect or absorb infrared rays to block radiant heat generated from other components in a process chamber having a relatively high temperature from being transferred to the substrate chuck 100. For example, the second heat block layer 420 may be disposed on the lower surface of the substrate chuck 100 exposed by the through hole 191 to reflect or absorb infrared rays traveling to the substrate chuck 100.

In exemplary embodiments, the second heat block layer 420 may include a material having a high infrared reflectance. For example, the second heat block layer 420 may include gold (Au), silver (Ag), titanium dioxide (TiO$_2$), aluminum nitride (AlN), zinc oxide (ZnO), or combinations thereof.

Figure 12:
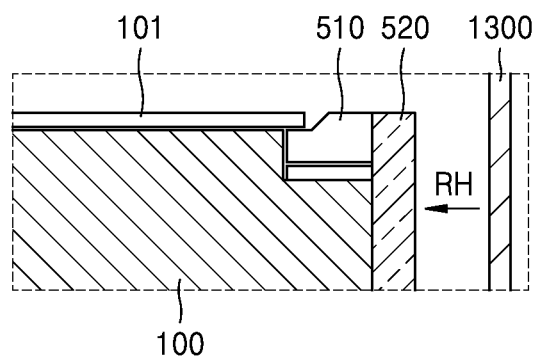
FIG. 12 is a cross-sectional view showing a part of a plasma processing apparatus according to exemplary embodiments.

FIG. 12 is a cross-sectional view showing a portion of a plasma processing apparatus according to exemplary embodiments.

Referring to FIG. 12, the plasma processing apparatus may include the substrate chuck 100 on which a substrate 101 is mounted, an edge ring 510, and a cover ring 520.

The edge ring 510 may be disposed on the substrate chuck 100 in the plasma processing apparatus. The edge ring 510 may surround an outer circumference of the substrate 101 that is seated on the substrate chuck 100. An inner portion of the edge ring 510 may be vertically overlapped with the substrate 101. The edge ring 510 may be disposed between the substrate chuck 100 and the cover ring 520. The edge ring 510 may be used to perform a semiconductor manufacturing process using a plasma processing process such as, for example, etching, deposition, etc.

The edge ring 510 may include a focus ring configured to further expand plasma generated in a process chamber 1300 of the plasma processing apparatus. In this case, when radio frequency power is applied to the substrate chuck 100 and an electric field is formed, since the radio frequency power is also applied to the edge ring 510, an electric field forming region may be expanded to a periphery of the edge ring 510.

In exemplary embodiments, the edge ring 510 may include a dielectric substance, an insulator, a semiconductor, or combinations thereof. For example, the edge ring 510 may include silicon (Si), silicon carbide (SiC), carbon (C), or combinations thereof.

The cover ring 520 may surround the outer circumference of the substrate chuck 100 and an outer circumference of the edge ring 510. The cover ring 520 may include an insulating material, and may surround the edge ring 510 and the substrate chuck 100 to protect the edge ring 510 and the substrate chuck 100.

The cover ring 520 may thermally separate the substrate chuck 100 from components provided in the periphery of the substrate chuck 100. For example, the cover ring 520 may prevent heat emitted from other components in the process chamber 1300 having a relatively high temperature from being transferred to the substrate chuck 100 and may be configured to reflect or absorb infrared rays.

In exemplary embodiments, the cover ring 520 may be an opaque reflector. For example, the cover ring 520 may include an insulator body containing impurities. For example, the cover ring 520 may include a quartz body doped with silicon impurities.

For example, when the plasma processing process is performed in the cryogenic temperature range, a temperature difference between the substrate chuck 100 and a peripheral component (for example, a chamber wall of the process chamber 1300) increases, which may cause a non-uniform temperature of the substrate chuck 100 due to a transfer of radiant heat RH between the peripheral component and the substrate chuck 100. At this time, the cover ring 520 may reflect or absorb infrared rays to reduce a temperature non-uniformity of the substrate chuck 100 and a temperature non-uniformity of the edge ring 510 due to the transfer of the radiant heat RH.

Figure 13:
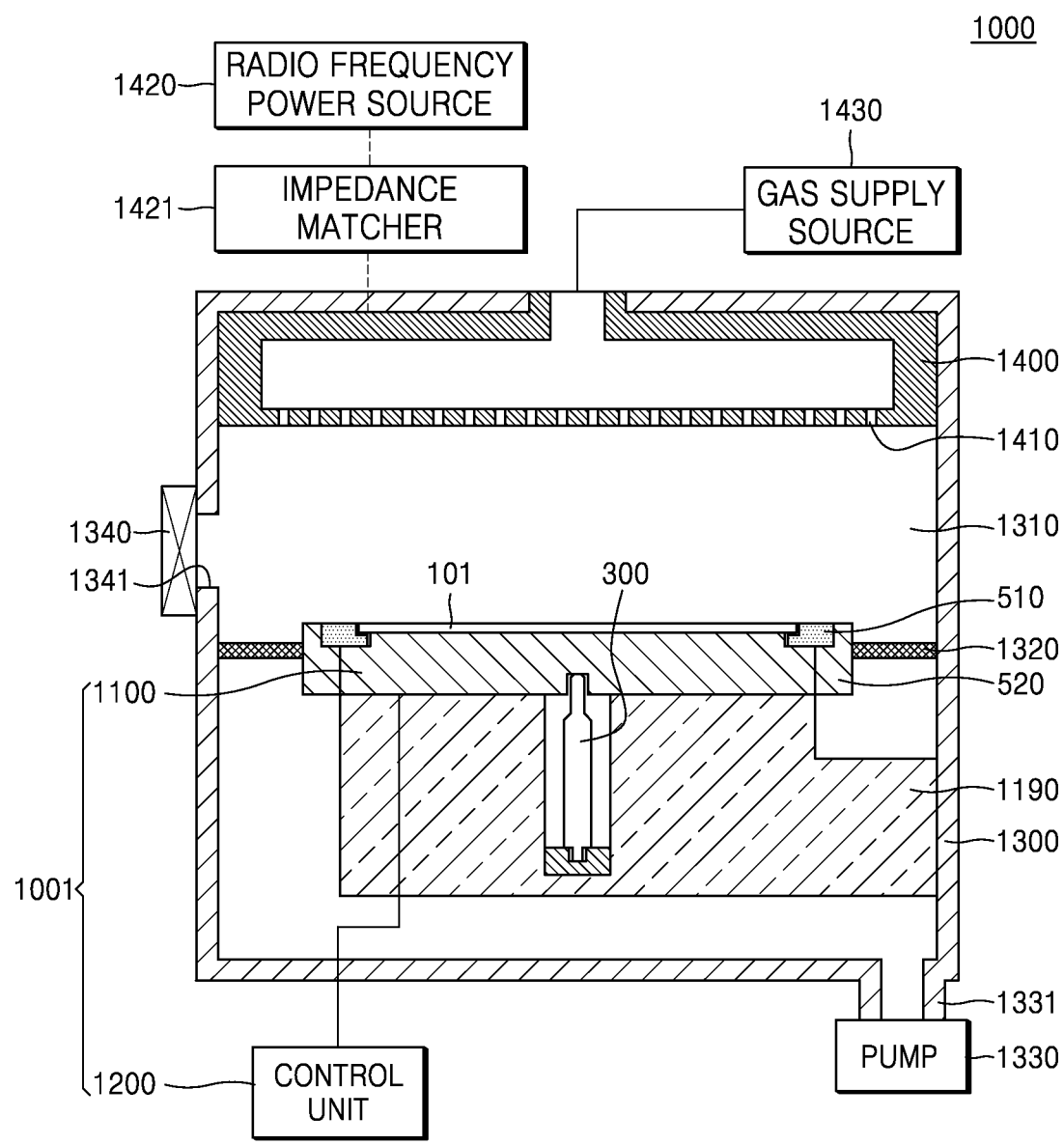
FIG. 13 is a cross-sectional view illustrating a plasma processing apparatus according to exemplary embodiments.
Figure 14:
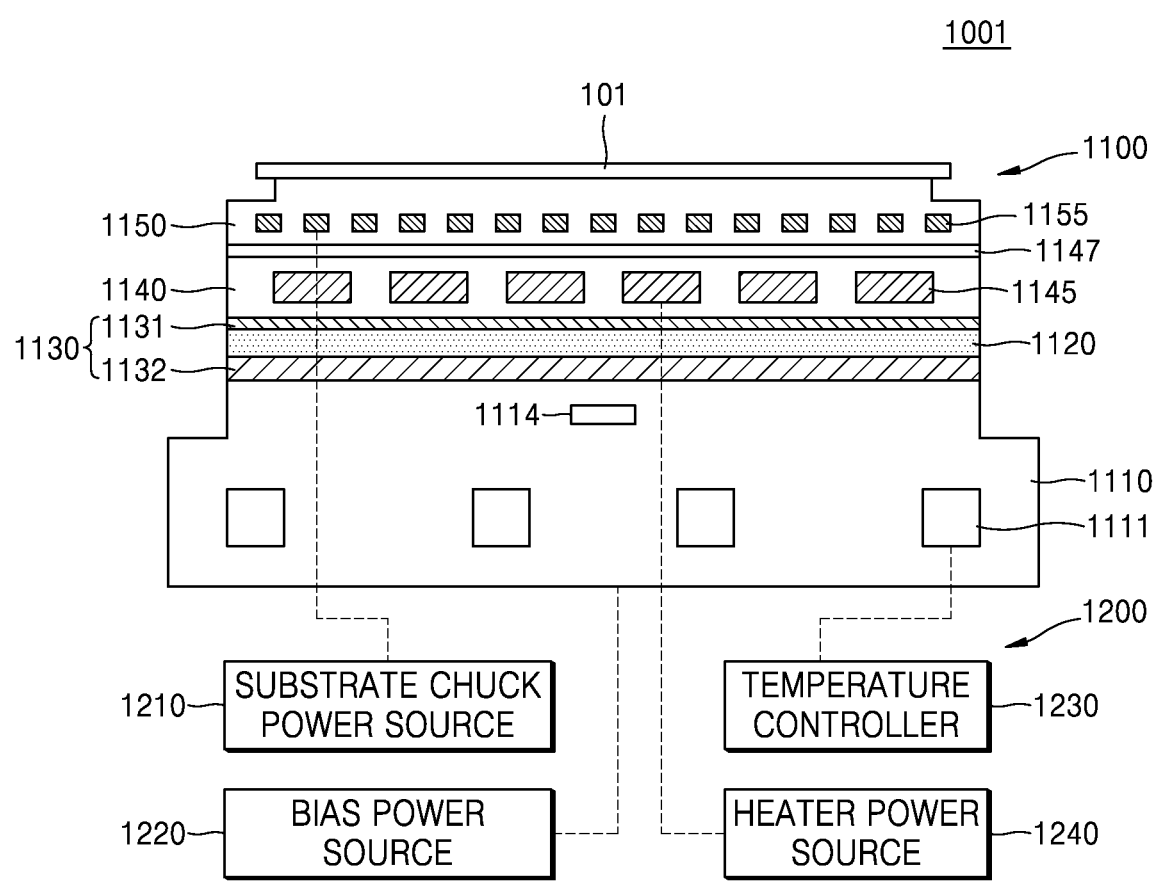
FIG. 14 is a cross-sectional view showing a substrate chuck assembly shown in FIG. 13 in more detail.

FIG. 13 is a cross-sectional view illustrating a plasma processing apparatus 1000 according to exemplary embodiments. FIG. 14 is a cross-sectional view showing a substrate chuck assembly 1001 shown in FIG. 13 in more detail.

Referring to FIGS. 13 and 14, a capacitively coupled plasma etching apparatus is described as an example of the plasma processing apparatus 1000. However, exemplary embodiments of the inventive concept are not limited to the capacitively coupled plasma etching apparatus, and may be applied to any apparatus using plasma. For example, exemplary embodiments of the inventive concept may be applied to an inductively coupled plasma etching apparatus or a plasma deposition apparatus.

The plasma processing apparatus 1000 may be a plasma etching apparatus capable of processing the substrate 101 in the process chamber 1300 using plasma. This may be referred to as, for example, a plasma etching process. The substrate 101 may be a wafer, for example, a silicon wafer. The process chamber 1300 may be a chamber including an inner space 1310, for example, a plasma chamber. A material film, for example, an oxide film or a nitride film, may be formed on the substrate 101.

The plasma processing apparatus 1000 may include the substrate chuck assembly 1001 having a substrate chuck 1100 on which the substrate 101 is mounted in the process chamber 1300. The substrate chuck assembly 1001 may include the substrate chuck 1100 fixing the substrate 101 and a control unit 1200 controlling an operation of the substrate chuck 1100. The substrate chuck 1100 may be the substrate chuck 100, 100a, 100b, 100c, or 100d described above with reference to FIGS. 1 to 12.

The substrate chuck 1100 may be an ESC for fixing the substrate 101 by an electrostatic force. In this case, the substrate chuck 1100 may include a base 1110, a heater dielectric layer 1140 bonded to the base 1110 by an adhesive layer 1130, and an electrostatic dielectric layer 1150. The adhesive layer 1130 may be a double-layer structure including a first adhesive 1131 and a second adhesive 1132. A metal plate 1120 may be further disposed between the first adhesive 1131 and the second adhesive 1132. The base 1110 may have a circular shape. The base 1110 may include a metal such as, for example, aluminum (Al), titanium (Ti), stainless steel, tungsten (W), or alloys thereof.

The base 1110 may be provided with a cooling channel 1111 through which a coolant flows. A flow rate and/or a temperature of the coolant circulating in the cooling channel 1111 may be controlled by a temperature controller 1230. The cooling channel 1111 may be the cooling channel 110, 110a, 110b, 110c, or 110d described above with reference to FIGS. 1 to 7. The temperature controller 1230 may be the temperature controller 200, 200a, or 200b described above with reference to FIGS. 1 to 7.

The base 1110 may be electrically connected to a bias power source 1220. Power generated by the bias power source 1220 may be applied to the base 1110 through the power rod 300, and accordingly, the base 1110 may serve as an electrode for plasma generation.

The base 1110 may include a temperature sensor 1114. The temperature sensor 1114 may transmit a measured temperature of the base 1110 to the control unit 1200. The temperature of the substrate chuck 1100 or the temperature of the substrate 101 may be detected based on the measured temperature transmitted from the temperature sensor 1114.

The heater dielectric layer 1140 may include an embedded heater electrode 1145. The heater dielectric layer 1140 may include a dielectric substance such as, for example, a ceramic such as aluminum oxide ($Al_2O_3$), aluminum nitride (AlN), or yttrium oxide ($Y_2O_3$), or a resin such as polyimide. The heater dielectric layer 1140 may have a circular or disc shape.

The heater electrode 1145 may include a conductor such as, for example, a metal such as tungsten (W), copper (Cu), nickel (Ni), molybdenum (Mo), titanium (Ti), a Ni—Cr alloy, a Ni—Al alloy, or a conductive ceramic such as, for example, tungsten carbide (WC), molybdenum carbide (MoC), titanium nitride (TiN), etc.

The heater electrode 1145 may be electrically connected to a heater power source 1240. The heater electrode 1145 may be heated by power, for example, an alternating current voltage, from the heater power source 1240 such that the temperature of the substrate chuck 1100 and the substrate 101 may be controlled. The heater electrode 1145 may have a concentric or helical pattern with respect to a central axis of the heater dielectric layer 1140.

The electrostatic dielectric layer 1150 may include an embedded adsorption electrode 1155. The adsorption electrode 1155 may be referred to as a clamp electrode. The electrostatic dielectric layer 1150 may include a dielectric substance such as, for example, a ceramic such as aluminum oxide ($Al_2O_3$), aluminum nitride (AlN), or yttrium oxide ($Y_2O_3$), or a resin such as polyimide. The electrostatic dielectric layer 1150 may have a circular or disc shape.

The substrate 101 may be disposed on the electrostatic dielectric layer 1150. The adsorption electrode 1155 may include a conductor, for example, a metal such as tungsten (W), copper (Cu), nickel (Ni), molybdenum (Mo), titanium (Ti), a Ni—Cr alloy, a Ni—Al alloy, or a conductive ceramic such as tungsten carbide (WC), molybdenum carbide (MoC), titanium nitride (TiN), etc.

The adsorption electrode 1155 may be electrically connected to a substrate chuck power source 1210. An electrostatic force may be generated between the adsorption electrode 1155 and the substrate 101 by power applied from the substrate chuck power source 1210, for example, a direct current voltage, such that the substrate 101 may be adsorbed on the electrostatic dielectric layer 1150.

A heat distribution layer 1147 may be disposed between the heater dielectric layer 1141 and the electrostatic dielectric layer 1150. The heat distribution layer 1147 may include a material having a thermal conductivity of about 10 W/mK or more. For example, the heat distribution layer 1147 may include aluminum nitride (AlN), boron nitride (BN), tungsten (W), molybdenum (Mo), etc. The heat distribution layer 1147 may cause heat generated in the heater electrode 1145 to be more uniform.

The substrate chuck power source 1210, the bias power source 1220, the heater power source 1240, and the temperature controller 1230 may constitute the control unit 1200. For example, the control unit 1200 may detect the temperature of the substrate chuck 1100 and the substrate 101 based on the measured temperature transmitted from the temperature sensor 1114. Further, the control unit 1200 may control the heater power source 1240 to adjust an amount of heat generated from the heater electrode 1145 or control the temperature controller 1230 to adjust a temperature of a coolant supplied to the substrate chuck 1100 based on detected temperature information. Thus, the temperature of the substrate chuck 1100 and/or the temperature of the substrate 101 may be appropriately controlled.

The substrate chuck 1100 may be supported by a support 1190. A heat block layer (e.g., the first heat block layer 410 in FIG. 10 or the second heat block layer 420 in FIG. 11) for blocking radiant heat from being transferred to the substrate chuck 1100 may be disposed below the substrate chuck 1100. The edge ring 510 that surrounds an edge of the substrate 101 and the cover ring 520 that surrounds an edge of the edge ring 510 and an edge of the substrate chuck 1100 may be disposed on the substrate chuck 1100.

A baffle plate 1320 may be disposed between the substrate chuck 1100 and the inner wall of the process chamber 1300. An exhaust pipe 1331 may be disposed in a lower portion of the process chamber 1300 and connected to a vacuum pump 1330. A gate valve 1340 may be disposed on an outer wall of the process chamber 1300, and may open and close, providing access to an opening 1341 into which and from which the substrate 101 is loaded.

An upper electrode 1400 spaced upward from the substrate chuck 1100 may be disposed on a ceiling of the process chamber 1300. The upper electrode 1400 may be electrically connected to a radio frequency power source 1420 through an impedance matcher 1421. The radio frequency power source 1420 may output radio frequency power suitable for plasma generation. The upper electrode 1400 may be connected to a gas supply source 1430 that supplies a process gas. For example, the upper electrode 1400 may be a showerhead electrode. The process gas supplied through the gas supply source 1430 may be injected into the process chamber 1300 through injection holes 1410 of the upper electrode 1400.

Figure 15:
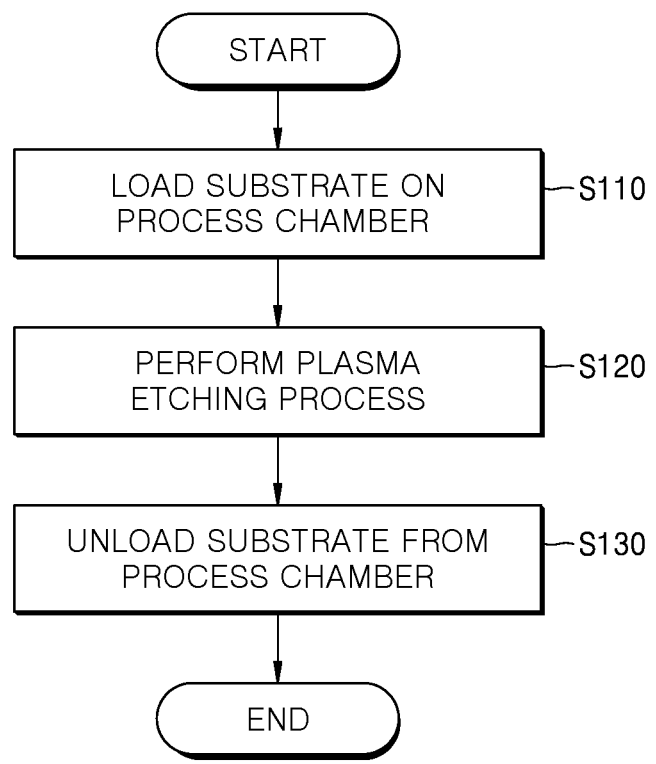
FIG. 15 is a flowchart for describing a method of manufacturing a semiconductor device using a plasma processing apparatus according to exemplary embodiments.
Figure 16A:
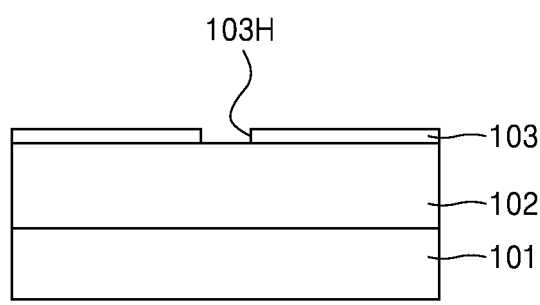
FIGS. 16A and 16B are views for describing a plasma etching process described with reference to FIG. 15.
Figure 16B:
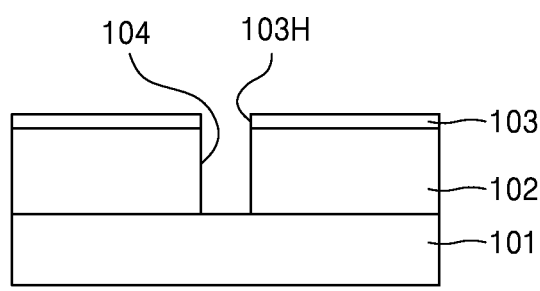

FIG. 15 is a flowchart for describing a method of manufacturing a semiconductor device using a plasma processing apparatus according to exemplary embodiments. FIGS. 16A and 16B are views for describing a plasma etching process described with reference to FIG. 15. Hereinafter, with reference to FIGS. 15, 16A, and 16B together with FIGS. 13 and 14, a method of manufacturing a semiconductor device using the plasma processing apparatus according to exemplary embodiments will be described.

Referring to FIG. 15, the substrate 101 may be loaded into a process chamber (S110). For example, the gate valve 1340 may be opened to load (or mount) the substrate 101 onto the substrate chuck 1100 in the process chamber 1300. The substrate chuck 1100 may fix the substrate 101 through an electrostatic force generated by power applied from the substrate chuck power source 1210.

Next, when the substrate 101 is fixed to the substrate chuck 1100, a plasma etching process may be performed on the substrate 101 (S120).

Referring to FIG. 16A, a first material film 102 and a mask pattern 103 may be formed on the substrate 101. The mask pattern 103 may have an opening 103H that exposes a part of the first material film 102.

Referring to FIG. 16B, plasma may be generated in the process chamber 1300 to remove a part of the first material film 102 exposed by the mask pattern 103, thereby forming holes 104 in the first material film 102. After the holes 104 are formed in the first material film 102, the mask pattern 103 may be removed.

For example, the process gas supplied by the gas supply source 1430 may be uniformly diffused into the inner space 1310 of the process chamber 1300 via the upper electrode 1400. Radio frequency power generated by the radio frequency power source 1420 may be applied to the upper electrode 1400 through the impedance matcher 1421. Since bias power from the bias power source 1220 is applied to the substrate chuck 1100, an electric field may be formed between the upper electrode 1400 and the substrate chuck 1100. Electrons accelerated by the electric field may collide with molecules or atoms of the process gas to generate plasma. The substrate 101 mounted on the substrate chuck 1100 may be exposed to the plasma generated in the process chamber 1300. The first material film 102 on the substrate 101 may be etched by physically and/or chemically reacting with the plasma.

Further, the plasma processing apparatus 1000 may perform a cryogenic etching process on the first material film 102 in a state in which a temperature of the substrate 101 is adjusted to a cryogenic temperature range, for example, a temperature range between about −20° C. and about −120° C., or a temperature range between about −50° C. and about −100° C. Since an etching profile may be controlled by the temperature of the substrate 101 during the plasma etching process, the plasma processing apparatus 1000 may control the temperature of the substrate chuck 1100 at a predetermined temperature, thereby performing an etching process with a high aspect ratio characteristic.

Next, when the plasma etching process on the substrate 101 is completed, the substrate 101 may be unloaded from the process chamber 1300 (S130).

According to exemplary embodiments, during a cryogenic etching process using plasma, although the substrate chuck 1100 has a significantly lower temperature than other components in the process chamber 1300, a temperature change of the substrate chuck 1100 by a transfer of radiant heat or conductive heat generated from a component of a high temperature may be reduced. Therefore, during the cryogenic etching process, the substrate 101 may have a substantially uniform temperature, a uniformity of the etching process may be improved, and an etching process with a high aspect ratio characteristic may be performed.

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:

1. A plasma processing apparatus, comprising:
   a process chamber;
   a substrate chuck disposed in the process chamber, wherein the substrate chuck is configured to receive a substrate and the substrate chuck comprises a cooling channel through which a coolant flows; and
   a temperature controller configured to control a temperature of the coolant supplied to the cooling channel,
   wherein the temperature controller comprises:
   a cooler configured to cool the coolant supplied to the cooling channel;
   a heater configured to heat the coolant supplied to the cooling channel; and
   a 3-way valve configured to regulate a first flow rate of the coolant flowing into the cooler and a second flow rate of the coolant flowing into the heater,
   wherein the cooling channel comprises:
   a first channel;
   a second channel disposed inside the first channel,
   wherein a first radial distance between an edge of the substrate chuck and the first channel is smaller than a second radial distance between the edge of the substrate chuck and the second channel;
   a connection channel extending between the first channel and the second channel; and
   a bypass channel branching off from the connection channel and extending to an outside of the substrate chuck,
   wherein the second channel is disposed near a central portion of the substrate chuck and the first channel is disposed near an edge portion of the substrate chuck, and
   when a temperature of the edge portion of the substrate chuck is higher than a temperature of the central portion of the substrate chuck, the temperature controller is configured to discharge the coolant to the outside of the substrate chuck through the bypass channel such that a third flow rate of the coolant flowing through the second channel is smaller than a fourth flow rate of the coolant flowing through the first channel.

2. The plasma processing apparatus of claim 1, wherein the temperature controller is configured to control a temperature of the substrate chuck by supplying, to the substrate chuck, a mixed coolant comprising a mixture of the coolant passing through the cooler and the coolant passing through the heater.

3. The plasma processing apparatus of claim 1, further comprising:
   a power rod connected to the substrate chuck and configured to transfer power to the substrate chuck,
   wherein the power rod comprises a core portion and a shell portion covering the core portion.

4. The plasma processing apparatus of claim 3,
   wherein the core portion comprises a first material,
   wherein the shell portion comprises a second material different from the first material, and
   wherein a thermal conductivity of the first material is lower than a thermal conductivity of the second material.

5. The plasma processing apparatus of claim 1, further comprising:
   a support disposed below the substrate chuck and configured to support the substrate chuck;
   a power rod disposed in a through hole of the support and connected to the substrate chuck, and configured to transfer power to the substrate chuck; and
   a heat block layer disposed on an inner wall of the support, wherein the inner wall is formed by the through hole.

6. The plasma processing apparatus of claim 1, further comprising:
   a support disposed below the substrate chuck and configured to support the substrate chuck; and a power rod disposed in a through hole of the support and connected to the substrate chuck, and configured to transfer power to the substrate chuck, wherein the through hole exposes a surface of the substrate chuck and a heat block layer is disposed on a surface of the substrate chuck.

7. The plasma processing apparatus of claim 1, further comprising:

a cover ring surrounding an outer circumference of the substrate chuck and comprising a quartz body doped with silicon impurities.

8. The plasma processing apparatus of claim 1, wherein the substrate chuck is an electrostatic chuck configured to fix the substrate to the electrostatic chuck with an electrostatic force.

9. A plasma processing apparatus, comprising:

a process chamber;

a substrate chuck disposed in the process chamber, wherein the substrate chuck is configured to receive a substrate and the substrate chuck comprises a cooling channel through which a coolant flows; and a temperature controller configured to control a temperature of the coolant supplied to the cooling channel of the substrate chuck, the temperature controller comprising a cooler configured to cool the coolant and a heater configured to heat the coolant, wherein the cooling channel comprises:

a first channel disposed near an edge portion of the substrate chuck;

a second channel disposed near a central portion of the substrate chuck;

a connection channel extending between the first channel and the second channel, and configured to guide the coolant flowing from the first channel toward the second channel; and a bypass channel diverged from the connection channel, extending to an outside of the substrate chuck through the edge portion of the substrate chuck, and configured to guide the coolant to the outside of the substrate chuck through the edge portion of the substrate chuck, wherein, when a temperature of the edge portion of the substrate chuck is higher than a temperature of the central portion of the substrate chuck, the temperature controller is configured to discharge the coolant to the outside of the substrate chuck through the bypass channel such that a flow rate of the coolant flowing through the second channel is smaller than a flow rate of the coolant flowing through the first channel.

10. The plasma processing apparatus of claim 9, further comprising:

a power rod connected to the substrate chuck and configured to transfer power to the substrate chuck, wherein the power rod comprises a core portion and a shell portion covering the core portion, the core portion comprises a first material, and the shell portion comprises a second material different from the first material.

11. The plasma processing apparatus of claim 9, further comprising:

a support disposed below the substrate chuck and supporting the substrate chuck;

a power rod disposed in a through hole of the support and connected to the substrate chuck, and configured to transfer power to the substrate chuck; and a first heat block layer disposed on an inner wall of the support, wherein the inner wall is formed by the through hole, wherein the through hole exposes a surface of the substrate chuck and a second heat block layer is disposed on the surface of the substrate chuck.

12. The plasma processing apparatus of claim 9, further comprising:

an edge ring surrounding an outer circumference of the substrate chuck; and a cover ring surrounding the outer circumference of the substrate chuck and an outer circumference of the edge ring, and comprising a quartz body doped with silicon impurities.

* * * * *